(12) United States Patent
Kister (10) Patent No.: US 7,345,492 B2
(45) Date of Patent: Mar. 18, 2008

(54) PROBE CARDS EMPLOYING PROBES HAVING RETAINING PORTIONS FOR POTTING IN A RETENTION ARRANGEMENT

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 128 days.

(21) Appl. No.: 11/302,650

(22) Filed: Dec. 14, 2005

(65) Prior Publication Data

US 2007/0132466 A1    Jun. 14, 2007

(51) Int. Cl.
G01R 31/02    (2006.01)
G01R 31/28    (2006.01)

(52) U.S. Cl. ..................................... 324/754
(58) Field of Classification Search ............... None
See application file for complete search history.

(56) References Cited

U.S. PATENT DOCUMENTS

| | | | |
|---|---|---|---|
| 5,936,421 A * | 8/1999 | Stowers et al. ............. | 324/761 |
| 6,066,957 A * | 5/2000 | Van Loan et al. .......... | 324/758 |
| 6,566,898 B2 | 5/2003 | Theissen et al. ............ | 324/754 |
| 6,586,955 B2 | 7/2003 | Fjelstad et al. ............. | 324/754 |
| 6,881,974 B2 | 4/2005 | Wood et al. ................. | 257/48 |
| 2002/0000815 A1 | 1/2002 | Fjelstad et al. ............. | 324/754 |
| 2002/0117330 A1 | 8/2002 | Eldridge et al. ............ | 174/260 |

* cited by examiner

*Primary Examiner*—Ha Tran Nguyen
*Assistant Examiner*—Trung Q. Nguyen
(74) *Attorney, Agent, or Firm*—Lumen Patent Firm, Inc.

(57) ABSTRACT

Method and apparatus using a retention arrangement with a potting enclosure for holding a plurality of probes by their retention portions, the probes being of the type having contacting tips for establishing electrical contact with pads or bumps of a device under test (DUT) to perform an electrical test. The retention arrangement has a top plate with top openings for the probes, a bottom plate with bottom openings for the probes, the plates being preferably made of ceramic with laser-machined openings, and a potting enclosure between the plates for admitting a potting agent that upon curing pots the retaining portions of the probes. In some embodiments a spacer is positioned between the top and bottom plates for defining the potting enclosure. Alternatively, the retention arrangement has intermediate plates located in the potting enclosure and having probe guiding openings to guide the probes.

15 Claims, 10 Drawing Sheets

PROBE CARDS EMPLOYING PROBES HAVING RETAINING PORTIONS FOR POTTING IN A RETENTION ARRANGEMENT

FIELD OF THE INVENTION

This invention relates generally to apparatus and method for retaining probes in an electrical testing arrangement such as a probe card, and more specifically to potting of such probes in a retaining arrangement belonging to the probe card to ensure superior mechanical and electrical performance.

BACKGROUND ART

The testing of semiconductor wafers and other types of integrated circuits (ICs), collectively known as devices under test (DUTs), needs to keep pace with technological advances. Each IC has to be individually tested, typically before dicing, in order to ensure that it is functioning properly. The demand for testing products is driven by considerations of new chip designs and higher volumes.

In particular, chips are getting smaller and they have more tightly spaced contact pads. The pads are no longer located about the circuit perimeter, but in some designs may be found within the area occupied by the circuit itself. As a result, the spacing or pitch of probe arrays required to establish electrical contact with the pads or bumps is decreasing. In addition, the requirements on planarity are increasing.

Some of the problems associated with small pitch of contact pads and their arrangement in a dense two-dimensional array are addressed in the prior art. For example, U.S. Pat. No. 6,881,974 to Wood et al. teaches to arrange probes in a probe card that has a substrate with a plurality of blind holes on a front face. The holes are filled with a metal to establish electrical contact for testing purposes and have closed bottoms spaced from a back of the substrate. Another approach is taught in U.S. Pat. No. 6,586,955 and U.S. Published Application No. 2002/0000815 both to Fjelstad et al. where probe cards include a layer of dielectric material provided with a plurality of cavities on a substrate. The dielectric material separates the fusible conductive material that is used to form the probe contacts. Both approaches provide ways to arrange probes that can address pads in a dense array.

In an approach that employs a housing for holding the individual probes, U.S. Pat. No. 6,566,898 to Theissen et al. teach an improved vertical pin probing device that has upper and lower spacers made of Invar. The spacers have a thin sheet of silicon nitride ceramic material held in a window in the spacer by an adhesive. The sheets of silicon nitride have laser-drilled matching patterns of holes supporting the probe pins and insulating them from the housing. The probes held in the holes can be arranged to address pads in a dense array.

Unfortunately, merely providing a geometry or method of holding probes that can address a dense array of pads is not sufficient. It is also important to ensure that the probes have suitable mechanical resilience and compliance properties. One way of addressing these mechanical issues is discussed, for example, in U.S. Published Application No. 2002/0117330 to Eldridge et al. This reference teaches structures that have improved resilience or compliance because the wire used for contact is overcoated with at least one layer of a material chosen for its structural resiliency or compliance characteristics. The probes have springable shapes and are attached to a substrate in, e.g., a probe card.

Although the prior art solutions individually address some of the problems, there is no apparatus or method that combines the requisite characteristics in a single probe card or testing apparatus. Specifically, what is needed is an electrical testing apparatus that can address densely packed pads or bumps with probes that are held securely while offering requisite mechanical properties such as resilience, compliance and reliable scrub motion to remove oxide from the pads or bumps.

OBJECTS AND ADVANTAGES

In view of the above prior art limitations, it is an object of the invention to provide for a method and apparatus for electrical testing of devices under test (DUTs) that have densely spaced contact pads or bumps. The object is to ensure that the probes used in such apparatus are appropriately held and designed to ensure advantageous mechanical properties, including resilience, compliance and scrub motion.

It is another object of the invention to ensure that the apparatus is easy to assemble and disassemble despite the small pitch of the probes.

These and other objects and advantages of the invention will become apparent from the ensuing description.

SUMMARY OF THE INVENTION

The objects and advantages of the invention are secured by a method and an apparatus for electrical testing of a device under test (DUT). The apparatus has a plurality of probes, each of which has a connect end for applying a test signal, a retaining portion, at least one arm portion and a contacting tip for making an electrical contact with the DUT, and more specifically with a pad or bump of the DUT. The apparatus has a retention arrangement for holding each of the probes by its retaining portion. The retention arrangement has a top plate with top openings for the probes, a bottom plate with bottom openings for the probes and a potting enclosure between the plates for potting the retaining portions of the probes in a potting agent. The openings for receiving the probes can be laser-machined openings. Furthermore, in some embodiments a spacer is positioned between the top and bottom plates for defining or delimiting the potting enclosure. Alternatively, the retention arrangement has intermediate plates located in the potting enclosure and having probe guiding openings to guide the probes. In this embodiment, it is important to ensure that there is sufficient inter-plate spacing between the intermediate plates to admit the potting agent.

In constructing the retention arrangement it is advantageous to provide an admission opening for receiving the potting agent. Thus, the potting agent can be poured into the retention arrangement once the probes are in place. As the potting agent cures and hardens, the probes are retained in their proper positions. A suitable potting agent is an epoxy of the type that solidifies or cures in the presence of atmospheric oxygen.

The apparatus of invention can be employed in various types of probe cards or similar testing equipment. In particular, it can be used in conjunction with a space transformer. The space transformer has contacts for contacting the probes at their connect ends and applying the test signals thereto.

The probes themselves can be of various types and geometries. For example, the probes have at least two arm portions. In some embodiments the probes have two arm portions: a base arm portion extending away from a center axis of the probe, and a reverse arm portion extending toward the center axis. The base arm portion and the reverse arm portion are joined at a knee. The contacting tip of the probe is located on the reverse arm portion distal from the knee. In a preferred embodiment, the contacting tip has a non-zero offset relative to the center axis. In other embodiments the probes have an arm portion that is non-linear, i.e., an arm portion that has a bend of varying curvature. Once again, it is preferable that the contacting tip have a non-zero offset relative to the center axis. In any of the above probes or in still other embodiments, the contacting tip is advantageously provided with a scrubbing protrusion for making the electrical contact with high reliability. Specifically, the presence of the scrubbing protrusion provides for a more effective scrubbing motion of the contacting tip over the DUT's pad, thereby removing any insulating oxidization.

The invention further extends to a method for electrical testing that may be implemented in any probe card or other electrical testing device. In accordance with the method, the plurality of probes is retained by the retaining portions in the retention arrangement that is provided for holding them. A potting agent is admitted into the potting enclosure created in the retention arrangement once the probes are in place. Once the potting agent cures, the probes will be reliably held in place. The potting agent is poured through an admission opening provided in the potting enclosure for receiving the potting agent.

A detailed description of the preferred embodiments of the invention is presented below in reference to the appended drawing figures.

DETAILED DESCRIPTION

Figure 1:
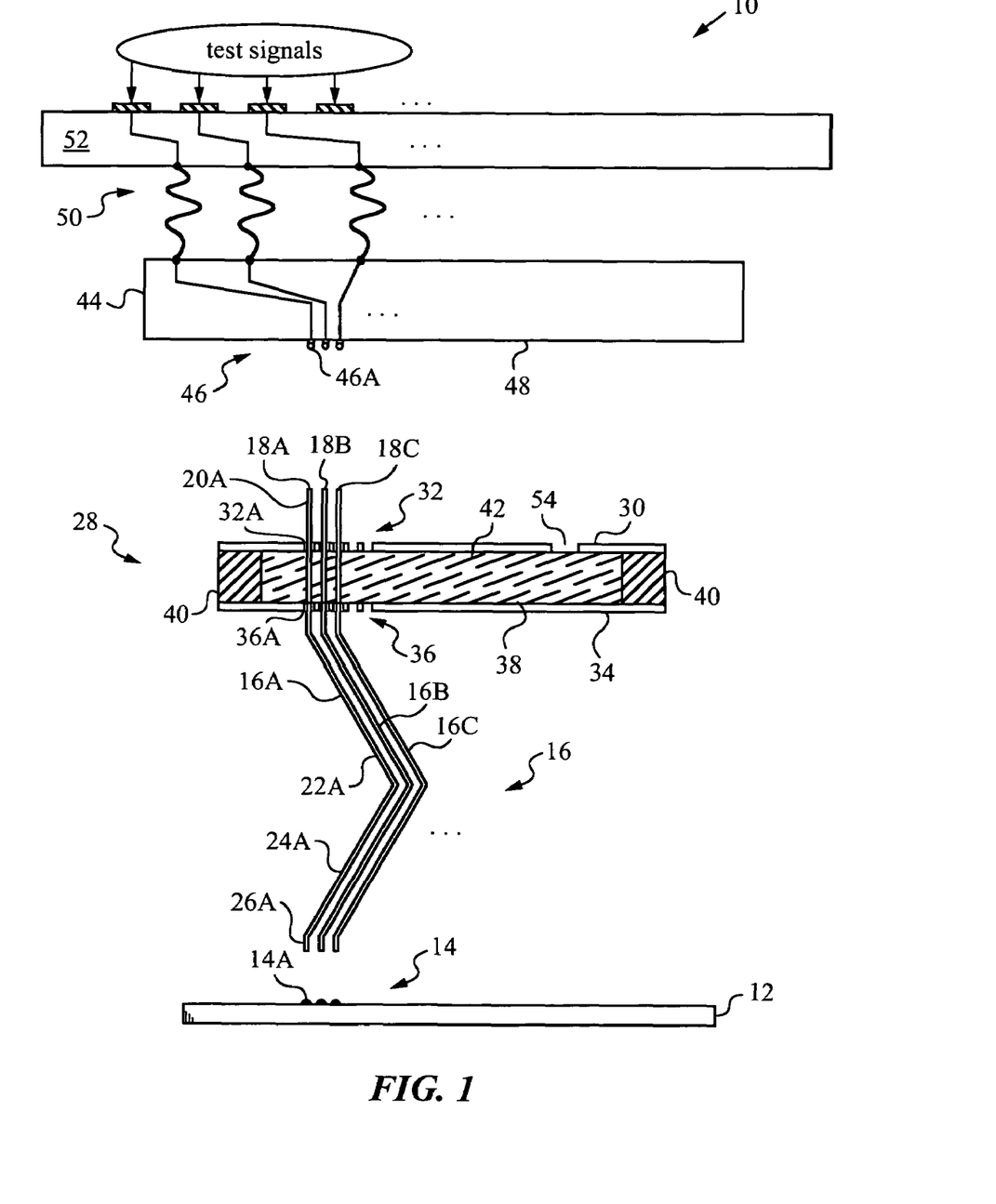
FIG. 1 is a diagram illustrating an apparatus of the invention employed with a space transformer.

The present invention will be best understood by first reviewing an apparatus 10 of the invention as shown in the diagram of FIG. 1. Apparatus 10 can be employed in a probe card or other electrical testing equipment for testing a device under test (DUT) 12. Frequently, DUT 12 is an integrated circuit on a wafer that requires testing prior to dicing. Alternatively, DUT 12 is an electronic device or circuit that is already mounted. The functionality of DUT 12 is verified by applying test signals to a number of its bumps or pads 14.

Apparatus 10 has a number of probes 16 arranged in an array and designed for establishing electrical contact with pads or bumps 14. Typically, the number of probes 16 is large and their spacing or pitch is very small, e.g., on the order of several microns. For clarity, only three probes 16A, 16B, 16C are illustrated. The construction of all probes 16 is analogous and will be explained by referring explicitly to probe 16A.

Probe 16A has a connect end 18A for applying the test signal, a retaining portion 20A and two arm portions 22A, 24A. Arm portion 24A terminates in a contacting tip 26A for making electrical contact with a corresponding bump 14A of DUT 12.

Apparatus 10 has a retention arrangement 28 for holding each of probes 16 by its retaining portion 20. Retention arrangement 28 has a top plate 30 with top openings 32 and a bottom plate 34 with bottom openings 36. Preferably, plates 30, 34 are made of ceramic plates. Openings 32, 36 are provided for receiving and guiding retaining portions 20 of probes 16. In particular, retention portion 20A of probe 16A passes through top opening 32A that is aligned with bottom opening 36A. To ensure accurate placement of probes 16 in retention arrangement 28 openings 32, 36 have to be precision machined. Thus, preferably, openings 32, 36 are laser-machined openings.

Retention arrangement 28 has a potting enclosure 38 contained between plates 30, 34. A spacer 40 is used to separate plates 30, 34 and keep them mutually parallel, thus defining potting enclosure 38. A potting agent 42 such as epoxy that hardens when in contact with atmospheric oxygen is poured into enclosure 38 and cured to keep probes 16 in their properly aligned positions.

In constructing retention arrangement 28 it is advantageous to provide an admission opening 54 for receiving potting agent 42 in potting enclosure 38. Potting agent 42 should be poured into potting enclosure 38 once probes 16 are properly aligned both horizontally and vertically. In particular, a sufficient level of planarity between contacting tips 26 of probes 16 should be ensured prior to pouring potting agent 42 into potting enclosure 38. As potting agent 42 cures and hardens, probes 16 are retained in their proper positions. A suitable potting agent is an epoxy of the type that solidifies or cures in the presence of atmospheric oxygen.

Apparatus 10 also has a space transformer 44 with probe contacts 46 on its bottom surface 48 for contacting probes 16 at their connect ends 18. Specifically, space transformer 44 is employed for establishing electrical connections between test signal leads 50 from a testing device 52, e.g., a testing circuit on a printed circuit board, and probes 16. In contrast to signal leads 50, probe contacts 46 on bottom surface 48 are densely spaced and can be directly connected to probes 16. For example, in the case of probe 16A, its connect end 18A is assigned to establish electrical connection with contact 46A. In practice this is preferably done by providing a soldering ball on contact 46A and soldering connect end 18A thereto. Other alternatives, such as a side friction connector between connect end 18A and contact 46A can also be used to establish electrical connection.

Space transformer 44 allows the user to convert relatively sparsely spaced leads 50 to an array of much more densely spaced or high pitch probe contacts 46 for accessing very densely spaced probes 16. Probes 16, in turn, require tight spacing in order to access very densely packed and small pads or bumps 14 of DUT 12. Various types of space transformers and routing strategies are known to those skilled in the art. Any of those can be applied in apparatus 10. In addition, testing device 52 can generate test signals directly, receive external instructions for generating test signals or simply receive some or all of the test signals and assign them to signal leads 50.

During operation probes 16 of apparatus 10 are placed in physical contact with bumps 14 to establish electrical contact. Electrical contact is not only due to physical contact, but also due to a scrubbing motion executed by contacting tips 26 of probes 16 while engaging with bumps 14. The scrubbing motion removes surface oxidation from bumps 14 and thus ensures a low-resistance electrical contact so that the test signals are efficiently delivered to bumps 14.

Figure 2:
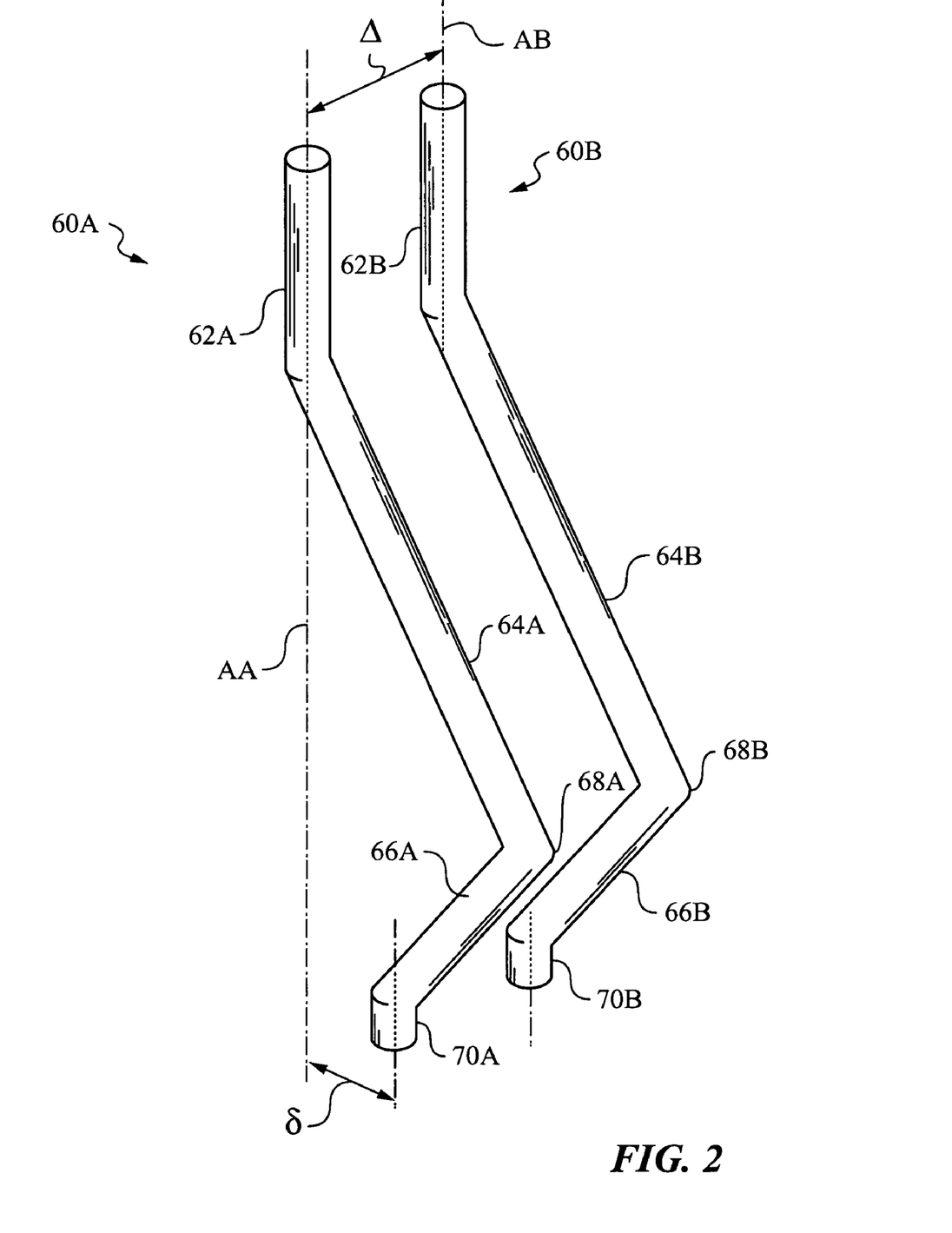
FIG. 2 is an isometric view of two probes that can be used in accordance with the invention.

Apparatus 10 can employ probes of various types and geometries, including probes with two or more arm portions. FIG. 2 is an isometric view of two exemplary probes 60A, 60B that can be used in apparatus 10. Each one of probes 60 has a retention portion 62A, 62B and two arm portions 64A, 66A and 64B, 66B, respectively. More precisely, arm portions 64A, 64B are base arm portions extending away from center axes AA, AB of probes 60A, 60B, and arm portions 66A, 66B are reverse arm portions extending back toward center axes AA, AB. Base and reverse arm portions 64A, 64B and 66A, 66B inflect at corresponding joints or knees 68A, 68B. This geometry lends probes 60A, 60B a measure of mechanical flexibility that allows contacting tips 70A, 70B of probes 60A, 60B to perform effective scrubbing movements when brought in contact with pads or bumps 14 of DUT 12.

Probes 60 have round cross-sections and are spaced at a pitch Δ. In a preferred embodiment, contacting tips 70A, 70B are located on reverse arm portions 66A, 66B distal from knees 68A, 68B with a non-zero offset δ relative to center axes AA, AB, respectively. Non-zero offset δ further improves the scrubbing behavior of probes 60.

Figure 3:
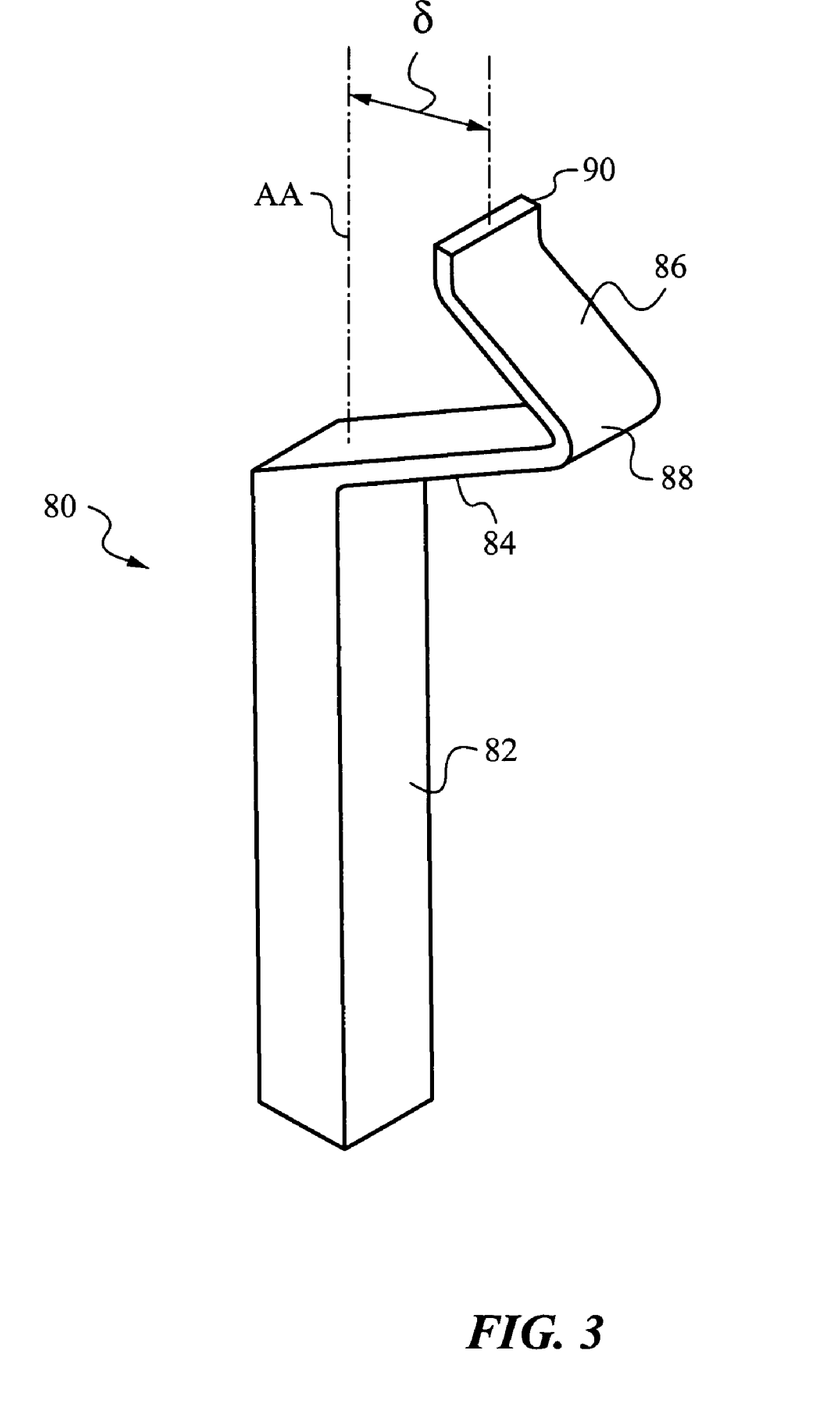
FIG. 3 is an isometric view of another probe that can be used in accordance with the invention.

Apparatus 10 can use other probes that have non-circular cross-sections. FIG. 3 illustrates in an isometric view of a probe 80 that has a generally rectangular and varying cross-section. Probe 80 has a retention portion 82, a base arm portion 84, a reverse arm portion 86, a knee 88 and a contacting tip 90. Once again, contacting tip 90 has a non-zero offset δ relative to a center axis AA of probe 80.

Figure 4:
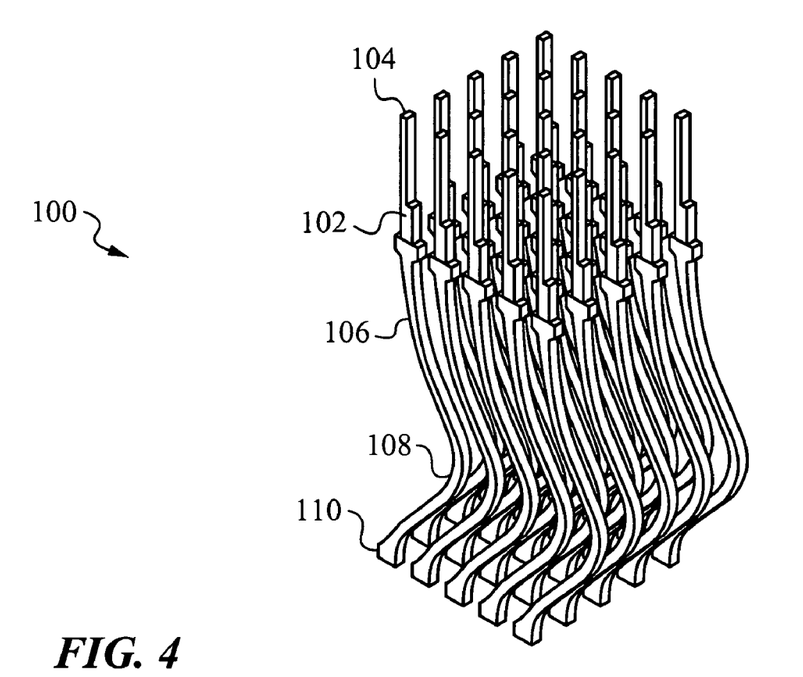
FIG. 4 is a three-dimensional view of other probes with non-linear portions.

In still other embodiments, apparatus 10 uses probes that have one or more non-linear arm portions. FIG. 4 illustrates an array of probes 100 each having a retention portion for being potted in retention arrangement 28 and a contact end 104. Each probe 100 has a non-linear arm portion 106 with a knee 108. Arm portion 106 terminates in a contacting tip 110. Note that contact end 104 of each probe 100 is designed for making side friction connections rather than a soldered connection. In other words, contact end 104 is designed to be placed into a metallized hole of a ceramic plate located above retention arrangement 28 and contact is established by sliding the ceramic plate sideways to ensure mechanical contact with contact end 104. In this case space transformer 44 establishes electrical connections with contact end 104 via a soldered connection to the ceramic plate. Alternatively, space transformer 44 may itself be provided with metallized holes for receiving contact end 104 of each probe 100. Also note, that in this embodiment there is no offset between contacting tip 110 and the center axis of probe 100.

Figure 5:
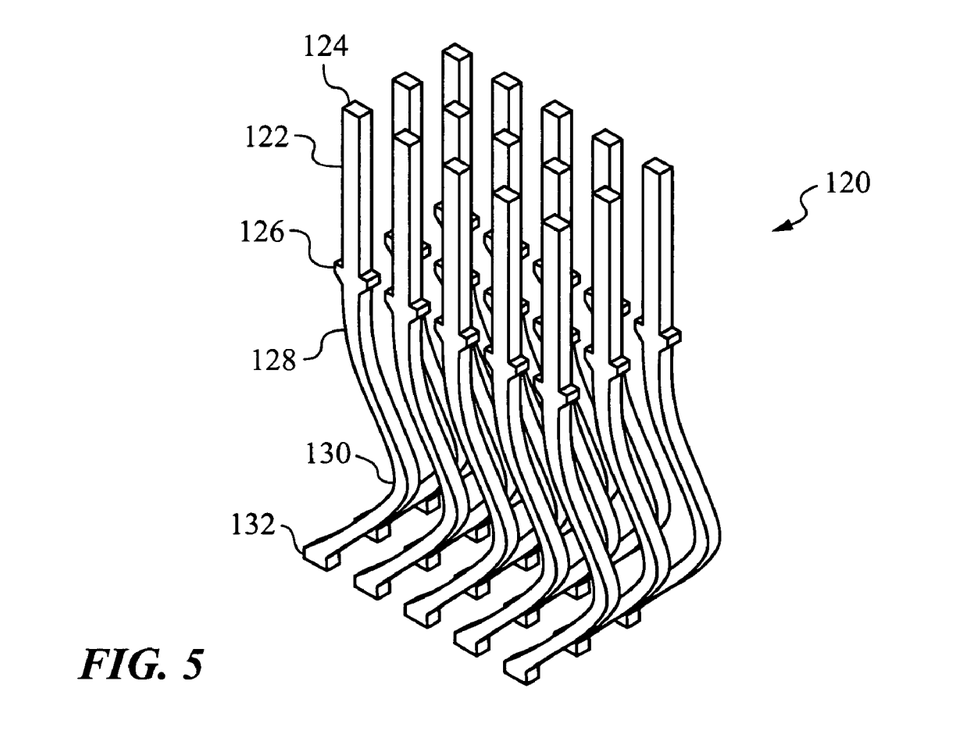
FIG. 5 is a three dimensional view of still other probes with non-linear portions.

FIG. 5. shows an array of probes 120 each having a retention portion 122 terminated in a contact end 124. A stop 126 is provided at the lower end of retention portion 122 to help align probes 120 in a retention arrangement and aid in maintaining their planarity. The presence of stop 126 also aids in keeping the potting agent in the potting enclosure during assembly.

Each probe 120 also has a non-linear arm portion 128 with a joint or knee 130. Non-linear arm portion 128 has a varying degree of curvature along its length and terminates in a contacting tip 132. Tip 132 is offset from the center axis of probe 120 in order to provide for improved scrubbing behavior.

Figure 6:
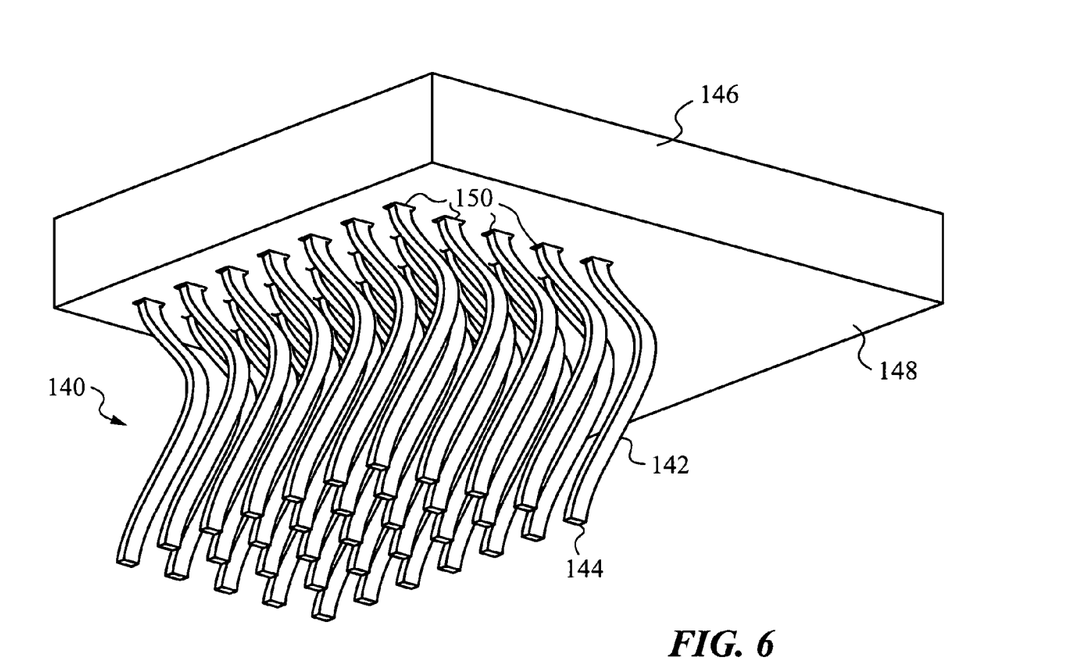
FIG. 6 is a three-dimensional view illustrating an array of probes held in a retention arrangement.

FIG. 6 is a three dimensional view illustrating an array of probes 140 each having a non-linear arm portion 142 and a contacting tip 144. Probes 140 are mounted in a retention arrangement 146 and extend out from bottom plate 148 through bottom openings 150. Arrangement 146 is fully assembled and probes 140 are potted in the potting agent contained inside the potting enclosure of arrangement 146.

Figure 7:
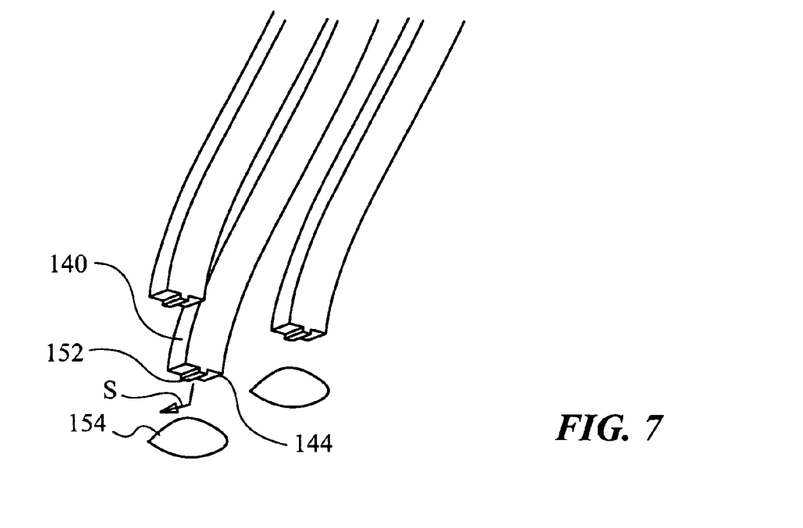
FIG. 7 is a three-dimensional view illustrating the operation of a scrubbing protrusion on a contacting tip of a probe from the array of FIG. 6.

FIG. 7 illustrates contacting tip 144 of a particular probe 140 in more detail. The bottom surface of tip 144, which is the surface that comes in contact with a pad or bump 154, is provided with a scrubbing protrusion 152. Protrusion 152 is a raised, rectangular portion of the bottom surface of tip 144. Although other geometries are possible, this type of protrusion 152 is preferred. During operation, as a contact force is applied, tip 144 comes in contact with bump 154 and executes a lateral scrubbing motion, as indicated by arrow S. The scrubbing motion helps to remove oxide from bump 154 and establish a good electrical contact.

Terminating the tips with scrubbing protrusions in any apparatus of the invention is preferred, since it improves the scrubbing behavior of the probes. It should also be noted, that due to the improved hold of the probes achieved by potting them in the potting enclosure, as well as any axial offset of their tips, all of these measures add together to produce a very effective scrubbing movement.

Figure 8:
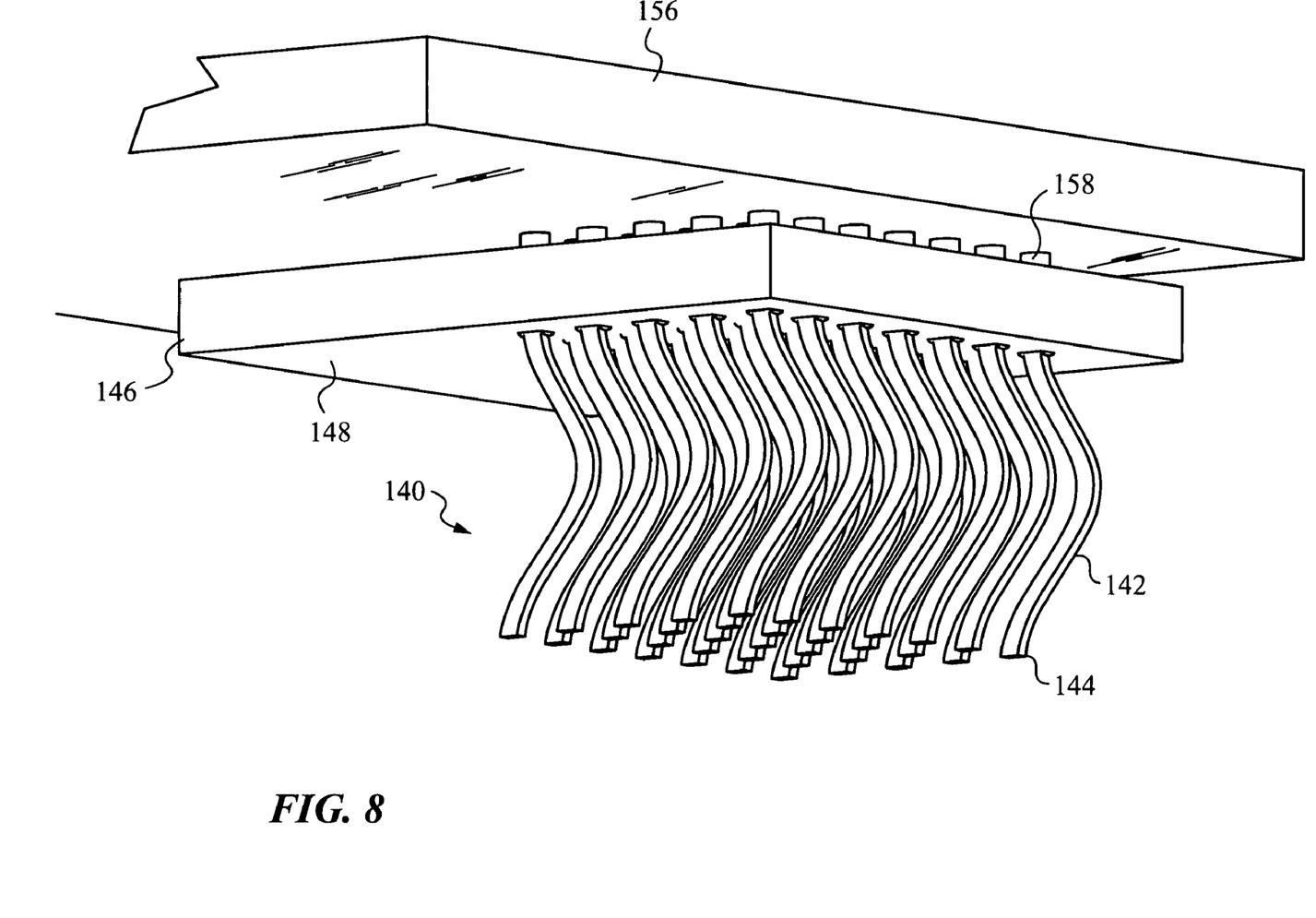
FIG. 8 is a three-dimensional view illustrating the array of probes and retention arrangement of FIG. 6 attached to a space transformer in accordance with the invention.

FIG. 8 is a three-dimensional view of the array of probes 140 in retention arrangement 146 attached to a space transformer 156. In this embodiment connections to space transformer 156 contacts are soldered connections 158. Once completed, connections 158 can be capped with an epoxy or adhesive for protection.

Figure 9:
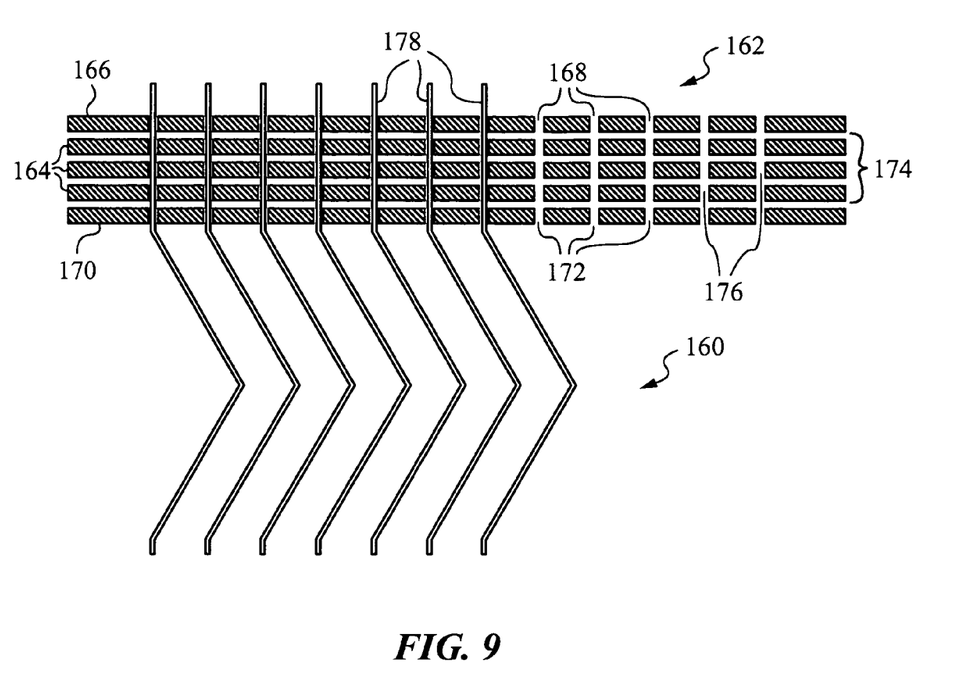
FIG. 9 is a plan cross sectional view illustrating a set of probes is a retention arrangement using intermediate plates in the potting enclosure according to the invention.

FIG. 9 is a plan cross sectional view illustrating a set of probes 160 is a retention arrangement 162 that employs intermediate plates 164. Arrangement 162 has a top plate 166 with top openings 168 and a bottom plate 170 with bottom openings 172. Intermediate plates 164 in effect define a potting enclosure 174, which does not require a spacer in this embodiment. Plates 164 have guiding openings 176 for guiding retaining portions 178 of probes 160 between top openings 168 and bottom openings 172.

Figure 10A:
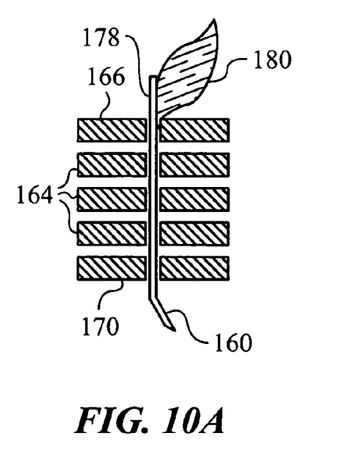
FIG. 10A-B are partial plan cross sectional views illustrating the wicking process responsible for potting probes in the retention arrangement of FIG. 9.
Figure 10B:
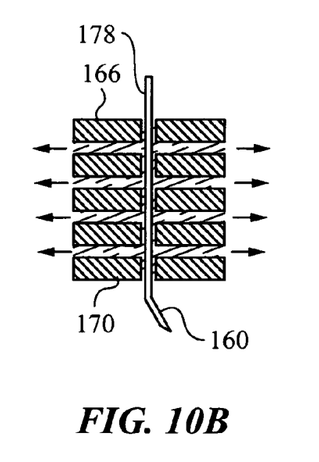

In this embodiment, it is important to ensure that inter-plate spacings between intermediate plates 164 and between intermediate plates 164 and top and bottom plates 166, 170 are sufficiently large to ensure admission of a potting agent 180 for proper potting, as shown in the partial views of FIGS. 10A&B. Specifically, as illustrated in FIG. 10A, potting agent 180 is admitted via top opening 168 and wicks along retaining portion 178 of probe 160. Given sufficient inter-plates spacings, agent 180 not only fills openings 168, 172 and guide openings 176, but also wicks its way between all plates 166, 170 and 164, as shown by the arrows in FIG. 10B. Thus, potting agent 180 fills entire potting enclosure 174 and then cures to produce a very strong and effective retention arrangement 162.

Figure 11:
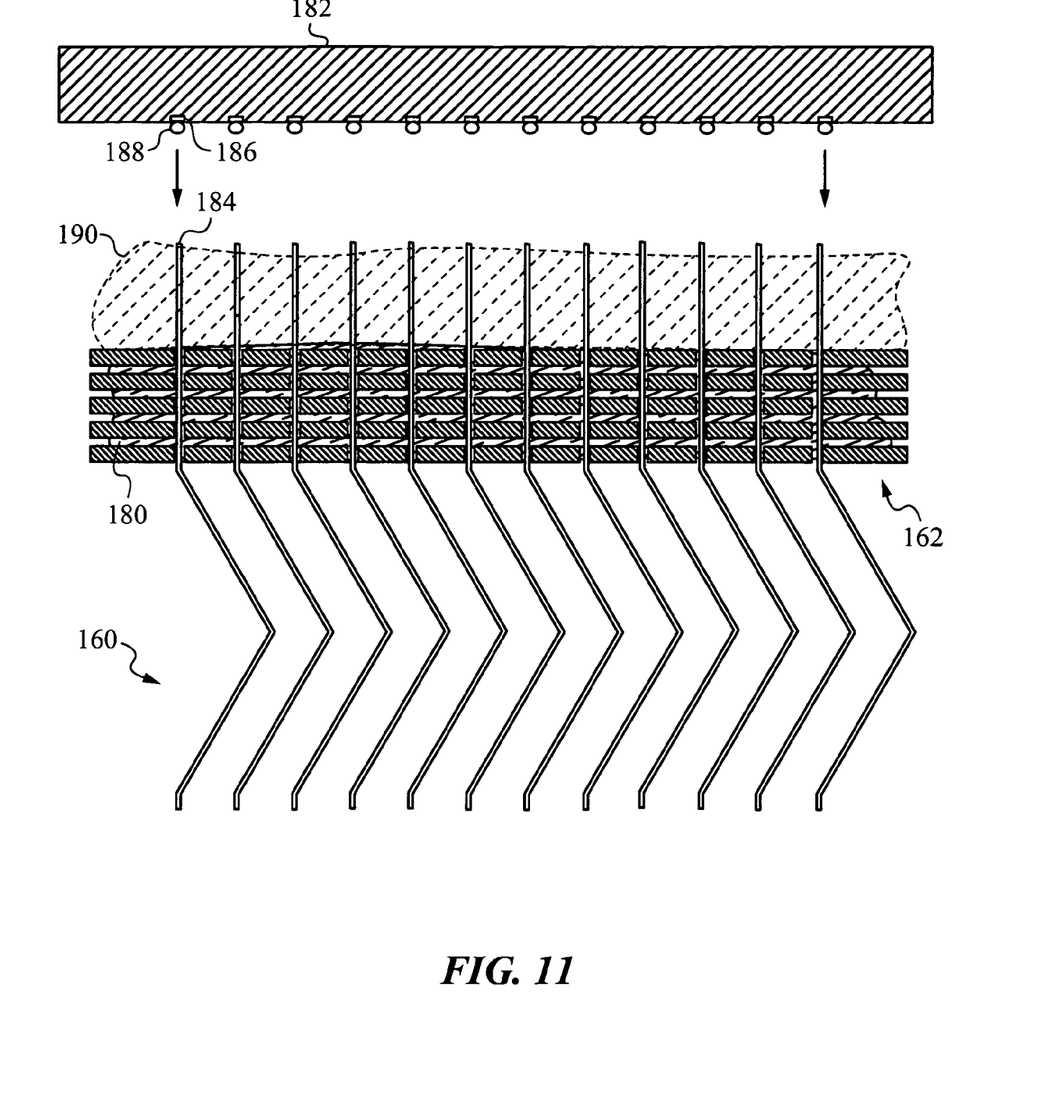
FIG. 11 is a plan cross sectional view illustrating a method of attaching probes held in a retention arrangement of FIG. 9 to a space transformer.

FIG. 11 is a cross-sectional view showing retention arrangement 162 with probes 160 already potted in potting agent 180 and being attached to a space transformer 182. To establish the electrical connection, connect ends 184 or probes 160 are brought in contact with and soldered to pads 186 of transformer 182 by re-flowing solder balls 188. Preferably, an underfill 190, typically of an epoxy or other stable dielectric is provided in order to strengthen the mechanical connection between transformer 182 and retention arrangement 162.

Figure 12A:
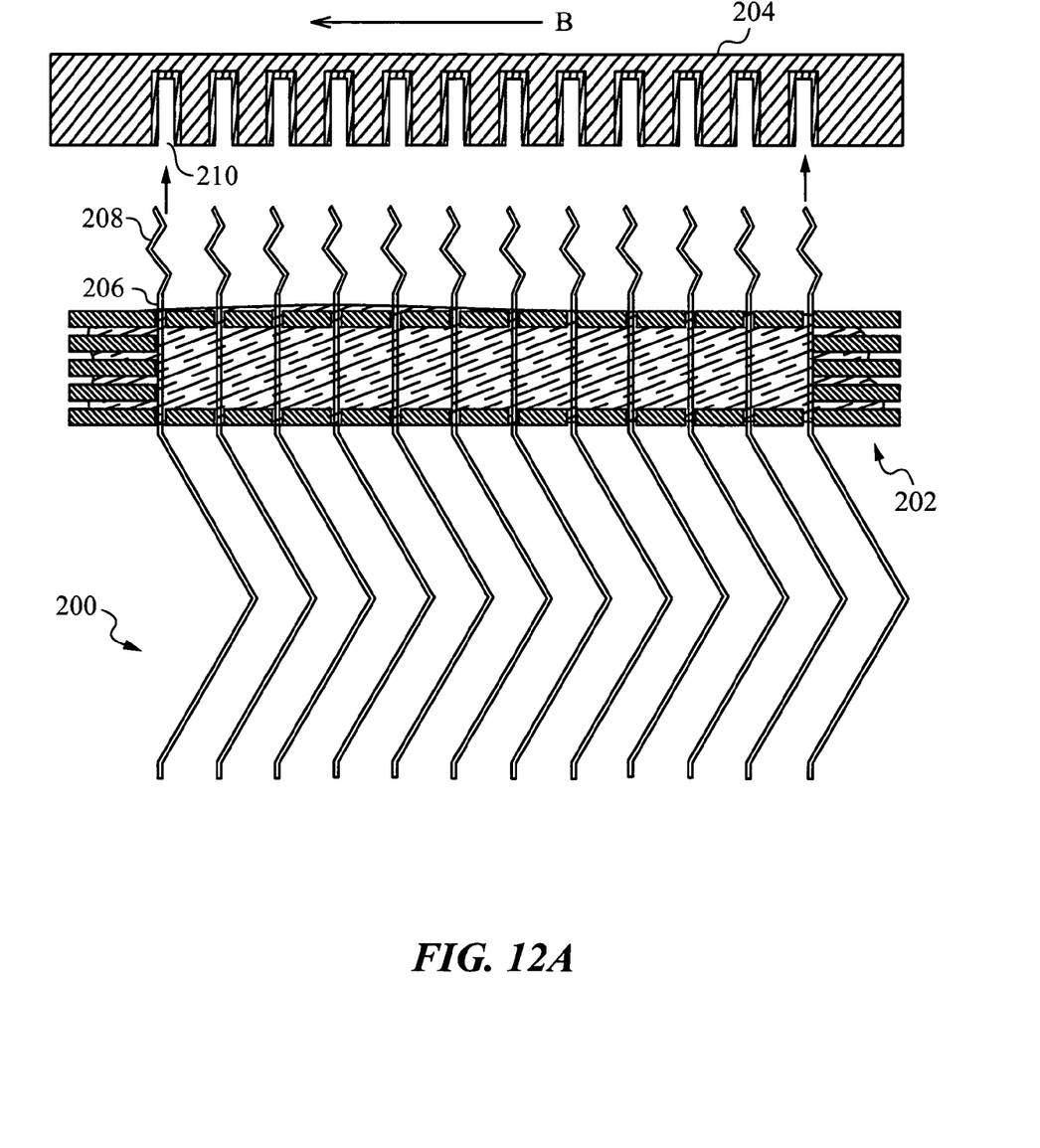
FIG. 12A is a plan cross sectional view illustrating an alternative method for attaching probes held in a retention arrangement to a space transformer.

FIG. 12A is a plan cross sectional view illustrating an alternative for attaching an array of probes 200 held in a retention arrangement 202 to a space transformer 204. In this embodiment, probes 200 are held in arrangement 202 by their retention portions 206. In addition to retention portions 206 probes 200 have spring sections 208 that are designed to fit inside metallized holes 210 directly in space transformer 204. Since spring sections 208 fit loosely into holes 210, a lateral bias is applied, as indicated by arrow B, to ensure proper electrical contact between spring sections 208 and the metal inside holes 210. It should be noted that spring sections 208 can have various geometric shapes, including straight, e.g., similar to that shown in FIG. 4.

Figure 12B:
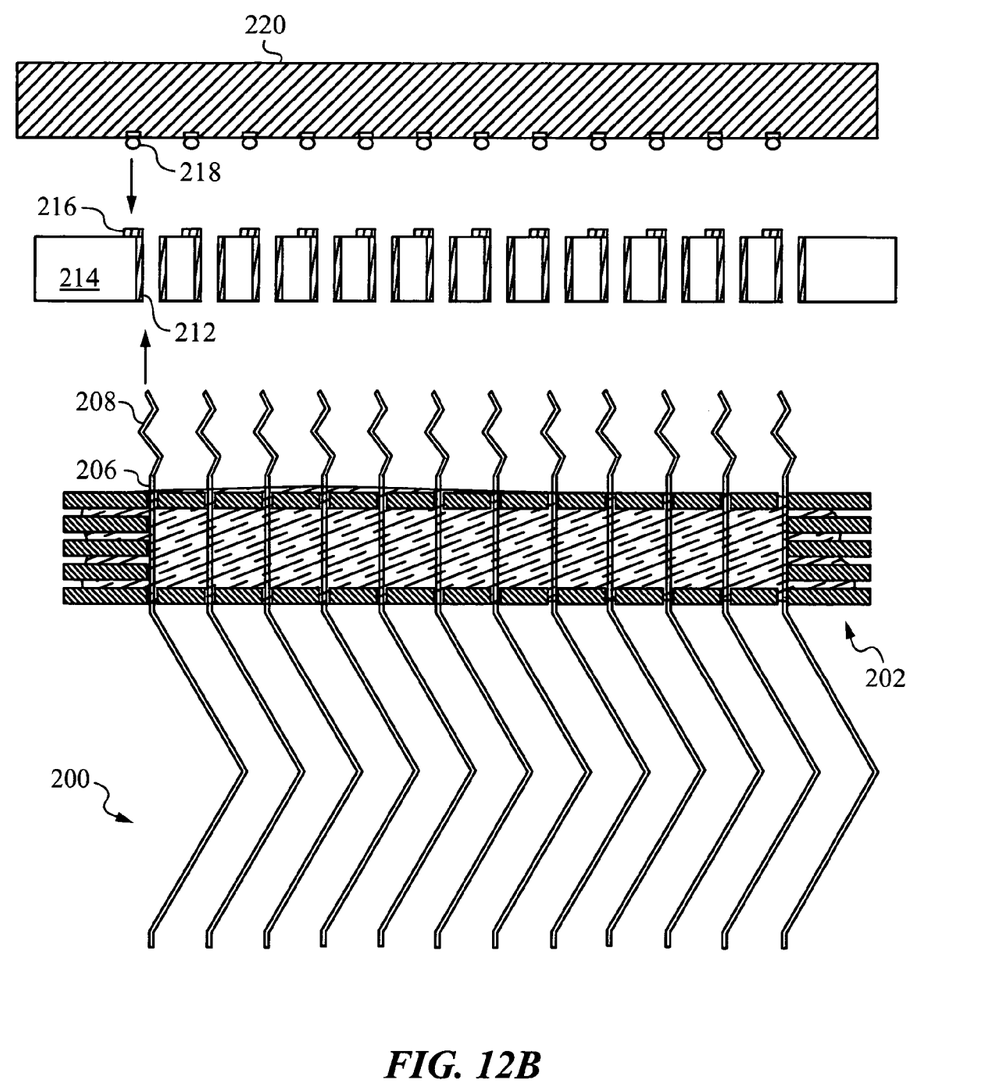
FIG. 12B is a detail view of an alternative manner of attaching probes to the space transformer.

FIG. 12B illustrates an alternative method of attaching probes 200 to a space transformer 220 by using a ceramic plate 212. In this case, spring sections 208 are designed to fit inside metallized holes 212 in a ceramic plate 214. Once spring sections 208 are placed in metallized holes 212, a lateral bias is applied to ensure proper contact. Plate 214 has pads 216 that are connected by metallization to holes 212. The connection with space transformer 220 is established by solder 218 re-flow to pads 216 of ceramic plate 214. The re-flow can take advantage of a low temperature solder 218, such that in the future, the connection between probes 200 and space transformer 220 can be detached. This may be desirable for maintenance purposes. In fact, the use of detachable connections renders the apparatus very easy to assemble and disassemble despite the small pitch of the probes.

Any of the above-described embodiments can be implemented in a full-fledged testing system or probe card. The retaining arrangement of the invention provides excellent mechanical characteristics to the probes it holds. In particular, even in very dense arrays that address densely packed probe pads or bumps the probes are held securely while offering requisite mechanical properties such as resilience, compliance and reliable scrub motion to remove oxide from the contact pads or bumps.

Many other embodiments of the apparatus and method are possible. Therefore, the scope of the invention should be judged by the appended claims and their legal equivalents.

I claim:
1. An apparatus for electrical testing, comprising:
   a) a plurality of probes, each of said probes having:
      I. a connect end for applying a test signal;
      II. a retaining portion;
      III. at least one arm portion; and
      IV. a contacting tip for making an electrical contact with a device under test;
   b) a retention arrangement for holding each of said probes by said retaining portion, said retention arrangement having:
      I. a top plate having top openings for said probes;
      II. a bottom plate having bottom openings for said probes; and
      III. a potting enclosure between said top plate and said bottom plate for potting said retaining portion in a potting agent.
2. The apparatus of claim 1, wherein said retention arrangement further comprises intermediate plates located in said potting enclosure and having probe guiding openings for said probes, said intermediate plates having sufficient inter-plate spacing to admit said potting agent therebetween.
3. The apparatus of claim 1, further comprising a spacer positioned between said top plate and said bottom plate for delimiting said potting enclosure.
4. The apparatus of claim 1, wherein said top openings and said bottom openings are laser-machined openings.
5. The apparatus of claim 1, wherein said retention arrangement further comprises an admission opening for receiving said potting agent.
6. The apparatus of claim 5, wherein said potting agent comprises an epoxy.
7. The apparatus of claim 1, further comprising a space transformer having contacts for contacting said probes at said connect end.
8. The apparatus of claim 1, wherein said probes each comprise at least two arm portions.
9. The apparatus of claim 8, wherein said at least two arm portions comprise a base arm portion extending away from a center axis of said probe, a reverse arm portion extending toward said center axis, and said probe further comprises a knee joining said base arm portion with said reverse arm portion.
10. The apparatus of claim 9, wherein said contacting tip is located on said reverse arm portion distal said knee and said contacting tip has a non-zero offset relative to said center axis.
11. The apparatus of claim 10, wherein said contacting tip further comprises a scrubbing protrusion.
12. The apparatus of claim 1, wherein said at least one arm portion comprises a non-linear arm portion.
13. The apparatus of claim 12, wherein said non-linear arm portion extends away from a center axis of said probe such that said contacting tip has a non-zero offset relative to said center axis.
14. The apparatus of claim 1, wherein said contacting tip has a protrusion for making said electrical contact.
15. The apparatus of claim 1, employed in a probe card.

* * * * *